United States Patent [19]

Gevondyan

[11] 4,362,574
[45] Dec. 7, 1982

[54] INTEGRATED CIRCUIT AND MANUFACTURING METHOD

[75] Inventor: Ara Gevondyan, Sunnyvale, Calif.

[73] Assignee: Raytheon Company, Lexington, Mass.

[21] Appl. No.: 167,176

[22] Filed: Jul. 9, 1980

[51] Int. Cl.³ .................. H01L 7/54; H01L 29/78
[52] U.S. Cl. ........................ 148/1.5; 29/576 B; 29/577 C; 148/187; 357/34; 357/43; 357/91
[58] Field of Search .............. 148/1.5, 187; 29/576 B, 29/577 C; 357/43, 91, 34

[56] References Cited

U.S. PATENT DOCUMENTS

| | | | |
|---|---|---|---|
| 4,066,917 | 1/1978 | Compton | 357/43 |
| 4,074,301 | 2/1978 | Palvinen | 357/23 |
| 4,108,686 | 8/1978 | Jacobus, Jr. | 148/1.5 |
| 4,113,513 | 9/1978 | DeBrebisson | 148/1.5 |
| 4,120,707 | 10/1978 | Beasom | 148/186 |
| 4,140,547 | 2/1979 | Shibata et al. | 148/1.5 |
| 4,143,392 | 3/1979 | Mylroie | 357/34 |
| 4,212,683 | 7/1980 | Jones et al. | 148/1.5 |
| 4,218,267 | 8/1980 | Maddox, Jr. | 148/1.5 |
| 4,233,615 | 11/1980 | Takemoto et al. | 357/22 |
| 4,276,095 | 6/1981 | Beilstein, Jr. | 148/1.5 |

OTHER PUBLICATIONS

Pippenger et al. Electronics Design, I (Jan. 1978) p. 104.

*Primary Examiner*—Upendra Roy
*Attorney, Agent, or Firm*—Richard M. Sharkansky; Joseph D. Pannone

[57] ABSTRACT

A method used to form a field effect device and a bipolar device in different regions of the same semiconductor material, such method including the step of forming a doped layer in the semiconductor material which extends from the surface of the semiconductor material to a predetermined depth in such semiconductor material and which extends laterally along the surface of the semiconductor material through the different regions wherein the field effect device and the bipolar device are formed. Such formed doped layer has the same type conductivity as that of the semiconductor material but has a doping concentration at least an order of magnitude greater than that of the semiconductor material. The doping concentration of the doped layer is sufficiently high to prevent undesired surface state inversion effects and enable effective control of the channel width of the field effect device. On the other hand, the doping concentration of the doped layer is sufficiently low to provide proper breakdown voltages for both the bipolar device and the field effect device. In this way, since the same doping concentration is used for both the bipolar device region and the field effect device region, the doped layer may be formed in the entire surface region of the semiconductor material without the requirement of additional masking steps. Further, with a buried channel field effect device the portion of the doped layer in the field effect device region provides the upper comparatively higher doped gate portion of the device while the portion of the semiconductor material below the buried channel region provides the lower gate portion of the device, such upper and lower gate portions being coupled to a gate electrode to enable control of the effective channel width from both upper and lower sides thereof.

1 Claim, 8 Drawing Figures

INTEGRATED CIRCUIT AND MANUFACTURING METHOD

BACKGROUND OF THE INVENTION

This invention relates generally to integrated circuit structures and manufacturing methods and more particularly to methods used in the manufacture of bipolar transistor devices and junction field effect transistor (JFET) devices on a common single crystal substrate.

As is known in the art, one technique used to form a buried channel JFET device is to ion implant particles into an epitaxial layer, spaced from the surface thereof, and extending between the source and drain regions, such particles being capable of forming a doped buried channel region having opposite type conductivity from the conductivity type of the epitaxial layer. An insulating layer is then formed over the surface of the epitaxial layer with opening formed therein to allow for source, gate and drain contacts. With such arrangement, since a portion of the epitaxial layer extends from the upper portion of the buried channel region to the insulating layer the doping concentration of the epitaxial layer must be sufficiently high, on the one hand, to prevent undesirable surface state inversion effects and must be sufficiently low, on the other hand, to provide the device with adequate breakdown voltage characteristics. To meet these conflicting requirements is, however, difficult.

One technique used to balance these conflicting requirements of breakdown voltage and surface state inversion is to provide a so-called "heavy top gate region" between the surface of the epitaxial layer and the buried channel region, such heavy top gate region having the same conductivity type as that of the epitaxial layer, but with a doping concentration much larger than that of both the epitaxial layer and the buried channel region. The heavy top gate region is, however, spaced from the source and drain regions. In this way the device will have a sufficiently high doping concentration in the heavy top gate region to prevent surface state inversion effects and, since such heavy top gate region is spaced from the source and drain regions (hence separated from such regions by portions of the more lightly doped epitaxial layer), the device will have adequate breakdown voltage characteristics. While such technique may provide a way of meeting the conflicting requirements of breakdown voltage and surface state inversion effects in the field effect device region, such technique requires an additional masking step, i.e., the step necessary to place the heavy top gate region accurately spaced from the source and drain regions, thereby complicating the manufacturing process and reducing device yield.

Another technique suggested to meet the conflicting requirements of surface state inversion effects and device breakdown voltage is to provide a moderately doped layer of semiconductor material between the surface of the epitaxial layer and the ion implanted buried channel region, such moderately doped layer having the same type conductivity as the epitaxial layer, but having a doping concentration slightly larger than, typically five times larger than, the doping concentration of the epitaxial layer but less than the doping concentration of the heavy top gate region described above. In this way the moderately doped region may extend laterally along the surface of the epitaxial layer through both the source and drain regions since its doping concentration level is sufficiently low to produce the desired breakdown voltage characteristics for the device and sufficiently high to provide adequate protection against surface state inversion over the field effect device region. When it is desired to produce both JFET devices and bipolar transistor devices on the same chip, however, a masking step has been used to prevent the moderately doped region from being formed in the regions of the chip where the bipolar devices are formed.

SUMMARY OF THE INVENTION

In accordance with the present invention a method is provided for the formation of a field effect device and a bipolar device in different regions of the same semiconductor material, such method including the step of forming a doped layer in the semiconductor material which extends from the surface of the semiconductor material to a predetermined depth in such semiconductor material and which extends laterally along the surface of the semiconductor material through the different regions wherein the field effect device and the bipolar device are formed. Such formed doped layer has the same type conductivity as that of the semiconductor material but has a greater doping concentration at least an order of magnitude greater than that of the semiconductor material and extends into the semiconductor material from the surface of such semiconductor material to a buried channel region formed in the field effect device. This doped layer provides the upper gate region of the buried channel field effect device.

In a preferred embodiment of the invention the doped layer is formed by implanting particles, preferably arsenic ions, through the surface of the semiconductor material, preferably silicon material. The structure is then heated to thermally grow an insulating layer, preferably silicon dioxide, over the surface of the semiconductor, portions of the surface of the semiconductor material being converted into the insulating material. The ion implantation energy and dosage are selected such that after the insulating layer has a desired thickness the doping concentration at the surface of the resulting semiconductor material is sufficiently high to prevent undesired surface state inversion effects and enable effective control of the channel width of the field effect device. On the other hand, the doping concentration of the doped layer is sufficiently low to provide proper breakdown voltages for both the bipolar device and the field effect device.

With such arrangement the entire surface of the semiconductor material may be subjected to ion implanted particles so that the doped layer may be formed across such surface without requiring separate masking steps, thereby reducing the complexity of the manufacturing process and increasing component yield.

BRIEF DESCRIPTION OF THE DRAWINGS

The foregoing features of this invention, as well as the invention itself, may be more fully understood from the following detailed description read together with the accompanying drawings, in which.

DESCRIPTION OF THE PREFERRED EMBODIMENTS

Figure 1:
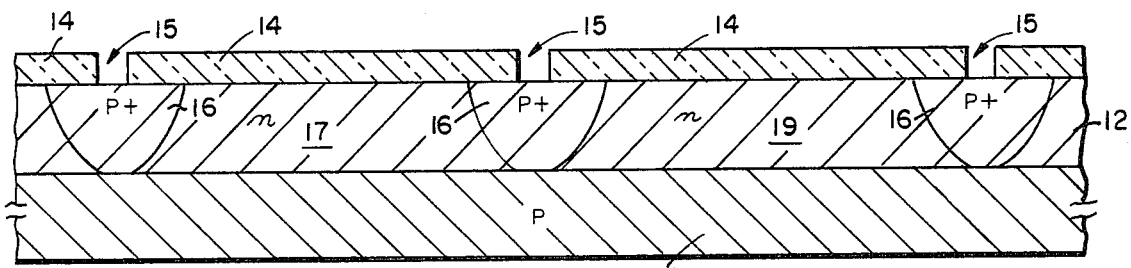
FIGS. 1-5 are cross-sectional diagrammatical views of a semiconductor structure having formed in different regions thereof a bipolar device and a buried channel junction field effect device at various steps in the manufacture thereof.

Referring now to FIG. 1, a substrate 10, here of p-type conductivity silicon, having a resistivity of 10 to 20 ohm-cm is provided. A silicon epitaxial layer 12 is formed on a surface of the substrate 10 using conventional techniques; here such epitaxial layer 12 is doped with arsenic atoms to have n-type conductivity, here with a doping concentration of the order of $10^{15}$ atoms per $cm^3$ to have a resistivity of 5 to 7.5 ohm-cm. A silicon dioxide layer 14 is formed over a surface of the epitaxial layer 12 using any conventional technique such as thermal oxidation. Windows 15 are formed in portions of the silicon dioxide layer 12 using conventional photolithographic-chemical etching processing. A suitable p-type dopant, here boron, is diffused through the windows 15 into regions 16 of the epitaxial layer 14 and down to the substrate 10, as shown, to form isolation regions 16 and thereby to provide isolated regions 17, 19 in the epitaxial layer 12. As will be described hereinafter, isolated region 17 will have formed therein a junction field effect transistor (JFET) device and isolated region 19 will have formed therein a bipolar transistor device.

Figure 2:
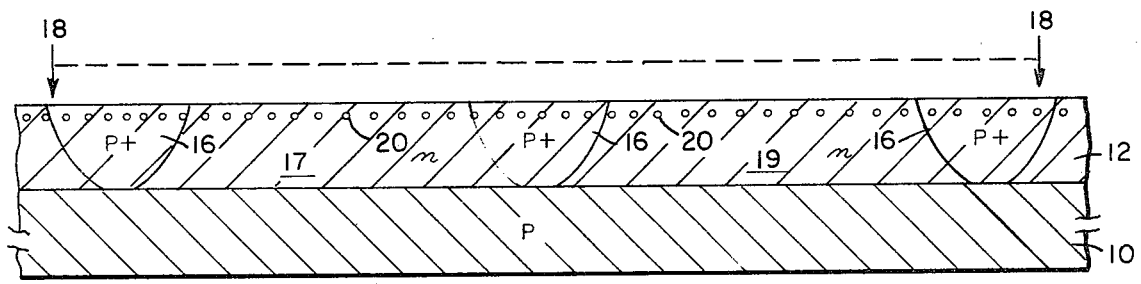

Referring now to FIG. 2, the silicon dioxide layer 14 (FIG. 1) is removed using any conventional process, here hydrofloric acid, as shown. The entire surface of the epitaxial layer 12 is next exposed to ions capable of providing n-type doping in the epitaxial layer 12. Here arsenic ions 20 are implanted through the silicon surface, as indicated by the arrows, 18, with an energy level here of 100 Kev and dosage of $2 \times 10^{12}$ cm$^{-2}$ to provide a peak doping concentration at a predetermined depth from the surface of the epitaxial layer 12. Here such energy and dosage result in the arsenic ions 20 implanted with a peak concentration, at approximately a 600 angstrom depth from the surface, of approximately $7 \times 10^{17}$ atoms per $cm^3$. The energy level and dosage of the implantation step are selected so that the resulting doping concentration profile will result in a device having the breakdown voltage characteristics desired by the JFET device and the bipolar device to be formed in isolated regions 17, 19 (here 60 volts) and also to provide adequate prevention of intolerable surface state inversion effects and effective control of the JFET channel width. It is noted that the implant is over the entire surface of the structure and hence no special masking step is required. That is, the implant may be performed over the entire surface of the semiconductor wafer being processed without any special masking.

Figure 3:
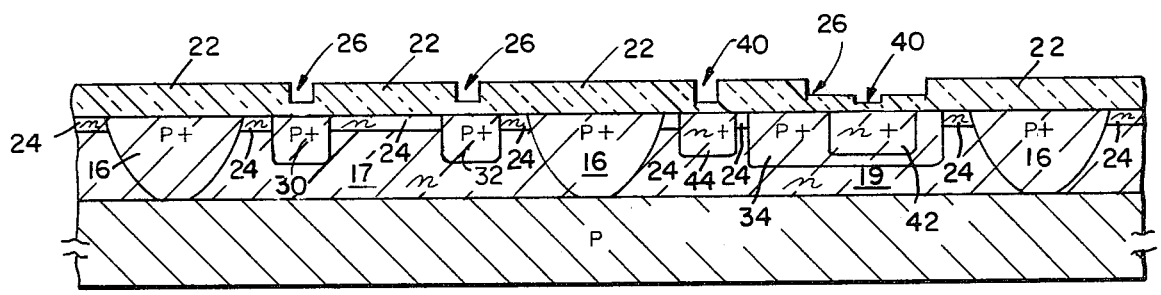

Referring now to FIG. 3, an insulating layer 22 is formed over the surface of the epitaxial layer 12, as shown; here such insulating layer 22 is silicon dioxide formed by heating the structure at a temperature of 1100° C., first in a dry oxygen environment for thirty minutes, then in steam for three hours, and finally in a dry oxygen environment for thirty minutes to thermally grow such layer to a thickness of here 1.2 micrometers. During the heating process the arsenic ions are activated to provide an n-type doped layer 24 which extends through both isolated regions 17 and 19. Further, during the growth of the silicon dioxide layer 22 a portion of the silicon epitaxial layer 12 is converted into the silicon dioxide layer 22, here the upper 5000 angstroms of the epitaxial layer 12. The implantation energy and dosage of the arsenic implant described in connection with FIG. 2 and the amount of the surface of the silicon epitaxial layer 12 converted into silicon dioxide layer 22 are selected so that arsenic doped layer 24 has a surface concentration of here $3 \times 10^{16}$ atoms per $cm^3$ and extends from the resulting surface of the epitaxial layer 12 to a depth of here 0.1 micrometers.

Windows 26 are next formed into portions of the silicon dioxide layer 22 using conventional photolithographic-chemical etching techniques, such windows 26 being disposed over the source region, drain region and base diffusion region to be formed. Next a suitable p+ type dopant, here boron, is diffused through the windows 26 to form source region 30, drain region 32, and base region 34, as shown. Here such regions 30, 32, 34 have a surface concentration of $10^{18}$ to $5 \times 10^{18}$ atoms per $cm^3$ and extend into the epitaxial layer 12 to a depth of here 3.2 to 3.6 micrometers.

During the process of diffusion in forming the source, drain and base regions 30, 32, 34, a layer of silicon dioxide is formed over the portions of the silicon epitaxial layer 12 exposed by windows 26. Next windows 40 are formed in the silicon dioxide layer 22 and a suitable n-type dopant, here phosphorus, is diffused through such windows 40 into the silicon epitaxial layer 12 to form an emitter region 42 and a collector contact region 44, as shown, here having a surface concentration of approximately $10^{20}$ atoms per $cm^3$ and simultaneously therewith a gate contact region (not shown in FIG. 3 but shown as region 59 in FIGS. 6 and 7 to be described hereinafter). During the diffusion process a portion of silicon dioxide is grown in the windows 40.

Figure 4:
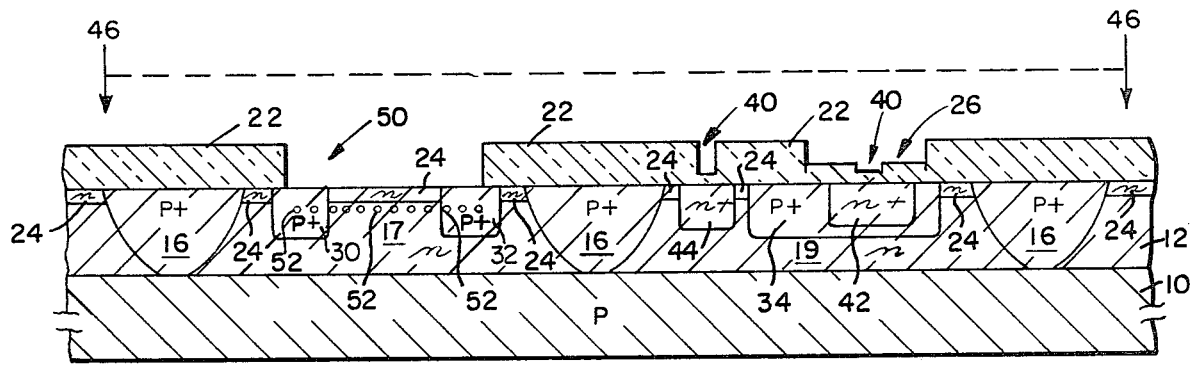
Figure 5:
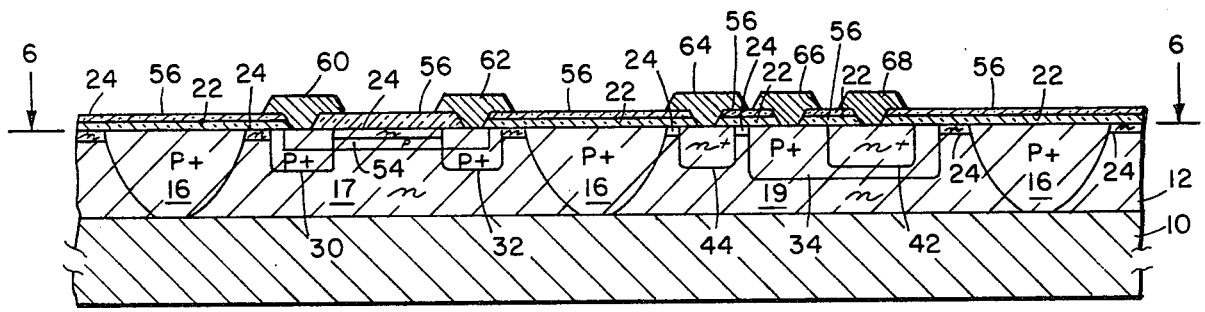
Figure 6:
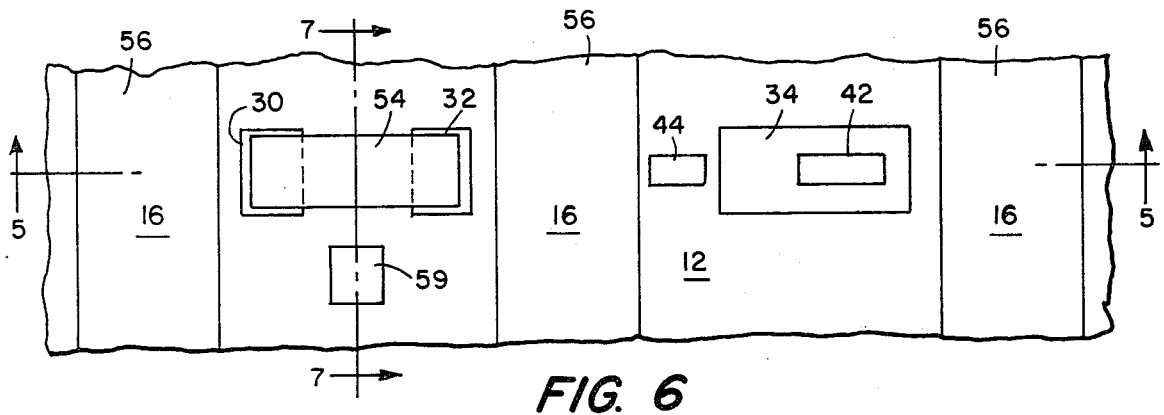
FIG. 6 is a top cross-sectional diagrammatical view of the semiconductor structure, such cross-section being taken along line 6—6 of FIG. 5.
Figure 7:
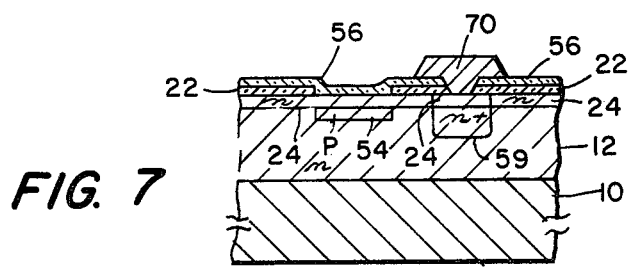
FIG. 7 is a cross-sectional diagrammatical view of the semiconductor structure, such cross section being taken along line 7—7 of FIG. 6.
Figure 8:
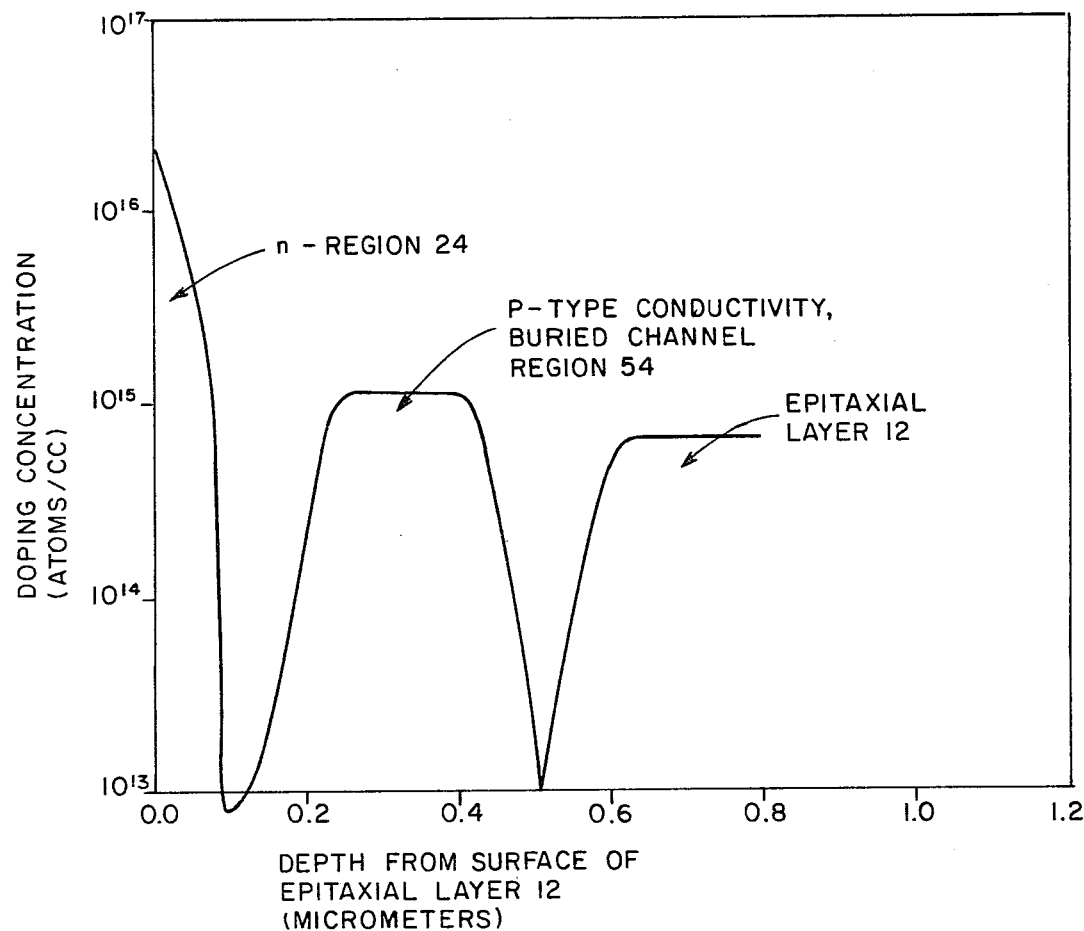
FIG. 8 is a curve showing the doping concentration levels in the semiconductor structure as a function of depth from the surface of such structure in the portion of the semiconductor structure where the buried channel region of the field effect device is formed.

Referring now to FIG. 4, a window 50 is formed in the silicon dioxide layer 22 using conventional photolithographic-chemical etching techniques to expose a portion of the surface of the silicon epitaxial layer 12 disposed between portions of the source and drain regions 30, 32, as shown. The surface of the structure thus formed is then exposed to boron ions 52 as indicated by arrows 46, using ion implantation, here by first using an energy level of 180 Kev and a dosage of $1.1 \times 10^{12}$ atoms per $cm^2$ and then using an energy level of 100 Kev and again a dosage of $1.1 \times 10^{12}$ atoms per $cm^2$ thereby causing a spreading of the ions 52 being implanted into the epitaxial layer 12. Referring now to FIGS. 5, 6 and 7, a layer of vapor deposited glass 56 is then formed over the surface of the structure at 450° C. The structure is heated at 1100° C. for fifteen minutes to: activate the implanted boron ions 52 (FIG. 4) and thereby form a p-type conductivity buried channel region 54 as shown in FIG. 5; and further diffuse the phosphorus in the emitter region 42 to its desired depth as shown for the resulting structure in FIGS. 5, 6 and 7. Electrodes 60, 62 are provided for the source and drain regions 30, 32 of the JFET device formed in isolated region 17. Electrodes 64, 66, 68 are provided for the collector, base and emitter regions 44, 34, 42, respectively, for the bipolar transistor formed in region 19. Also, a gate electrode 70 is provided for the gate contact region 59 (FIGS. 6 and 7). The doping concentration as a function of depth from the surface of the epitaxial layer 12 though the buried channel region 54 of the field effect device is shown in the curve shown in FIG. 8. It is noted in FIG. 7 that the portion of the epitaxial layer 12 disposed beneath the buried channel region 54 and the portion of the doped layer 24 disposed above the buried channel region 54 are both electrically connected to the gate electrode 70 and thereby control of the effective channel width from both the lower and especially the upper sides of the buried channel region 54. That is, the portions of the epitaxial layer 12 and the buried layer 24 disposed below and above the buried channel region 54 provide lower and upper gate regions, respectively, to effectively control the channel width in accordance with a signal fed to the gate electrode 70.

It is noted that the doping concentration of the doped layer 24 is sufficiently high to protect against surface state inversion effects and enable effective control of the channel width of the field effect device. On the other hand, the doping concentration of the doped layer is sufficiently low for both the bipolar device and the field effect device so that such devices have proper breakdown voltage characteristics. Hence, one single layer, such as the doped layer 24, may be used in both the JFET region and the bipolar region. Consequently, this layer 24 may be formed over the entire surface of the wafer without additional masking; that is, such layer 24 may be formed over the entire surface of the wafer without additional masking. To put it another way, layer 24 may be formed as a field implanted layer, as described, since the extension of the doped layer 24 into the bipolar transistor device isolated region 19 does not adversely effect the breakdown voltage characteristics of the device. Further, the use of an arsenic implant in the formation of doped layer 24 allows the, source and drain contact diffusion regions and later the emitter diffusion region to be formed subsequent to the arsenic implant because the arsenic dopant does not readily become absorbed into the silicon dioxide layer 22 during the thermal formation of such layer 22 as described in connection with FIG. 3. Consequently, the processing complexity in forming both JFET devices and bipolar devices on a single crystal substrate has been reduced by including a field implant, preferably of arsenic, but antimony may also be used, which extends throughout the surface of the wafer without the requirement of any masking step, the implanted arsenic being adapted to produce a doped layer which provides both devices with an adequate breakdown voltage characteristic and prevents undesired surface state inversion effects.

Having described a preferred embodiment of this invention, it is now evident that other embodiments incorporating its concepts may be used. It is felt, therefore, that this invention should not be restricted to such preferred embodiment, but rather should be limited only by the spirit and scope of the appended claims.

What is claimed is:

1. A method for forming a field effect device having source and drain regions formed in a first region of a semiconductor material and a bipolar device having base, collector and emitter regions formed in a second, different region of the same semiconductor material, such field effect device having a buried channel region formed in the semiconductor material and spaced from a surface of such semiconductor material, such buried channel region having a conductivity type opposite the conductivity type of the semiconductor material, comprising the steps of:

(a) forming a doped layer in the semiconductor material extending from the surface of the semiconductor material to the buried channel region, such doped layer extending laterally along the surface of the semiconductor material through the source and drain regions of the field effect device and the emitter and base regions of the bipolar device, such doped layer having the same conductivity type as the conductivity type of the semiconductor material; and, (b) forming a gate electrode electrically connected to both the formed doped layer and the semiconductor material.

* * * * *